United States Patent
Yuan

(10) Patent No.: US 7,231,000 B2
(45) Date of Patent: Jun. 12, 2007

(54) SYSTEM AND METHOD FOR DC OFFSET COMPENSATION AND BIT SYNCHRONIZATION

(75) Inventor: Rebecca Yuan, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 809 days.

(21) Appl. No.: 10/035,567

(22) Filed: Oct. 22, 2001

(65) Prior Publication Data

US 2003/0076902 A1 Apr. 24, 2003

(51) Int. Cl.
*H04L 25/10* (2006.01)
(52) U.S. Cl. .................................... 375/319
(58) Field of Classification Search ............... 375/137, 375/142–143, 149–150, 152, 285, 317, 319, 375/326, 355, 362, 365; 455/75, 334, 283, 455/296; 370/503, 509, 512
See application file for complete search history.

(56) References Cited

U.S. PATENT DOCUMENTS

| | | | | |
|---|---|---|---|---|
| 5,566,214 A | * | 10/1996 | Kroeger et al. | 375/355 |
| 5,629,960 A | * | 5/1997 | Dutkiewicz et al. | 375/346 |
| 5,640,416 A | * | 6/1997 | Chalmers | 375/147 |
| 5,644,600 A | * | 7/1997 | Kawai | 375/286 |
| 5,654,991 A | * | 8/1997 | Andren et al. | 375/355 |
| 5,724,384 A | * | 3/1998 | Kim et al. | 375/149 |
| 5,768,323 A | * | 6/1998 | Kroeger et al. | 375/355 |
| 5,818,544 A | * | 10/1998 | Han | 348/725 |
| 5,844,935 A | * | 12/1998 | Shoji | 375/150 |
| 5,867,525 A | * | 2/1999 | Giallorenzi et al. | 375/145 |
| 6,141,372 A | * | 10/2000 | Chalmers | 375/147 |
| 6,229,839 B1 | * | 5/2001 | Levin et al. | 375/142 |
| 6,236,648 B1 | * | 5/2001 | Umetsu | 370/342 |
| 6,370,205 B1 | * | 4/2002 | Lindoff et al. | 375/319 |
| 6,643,336 B1 | * | 11/2003 | Hsieh et al. | 375/343 |
| 6,873,666 B2 | * | 3/2005 | Chen | 375/343 |

OTHER PUBLICATIONS

Specification of the Bluetooth System, Wireless Connections Made Easy v. 1.0B Dec. 1, 1999, pp. 1-1080Specification vol. 1.

* cited by examiner

*Primary Examiner*—Khanh Tran
(74) *Attorney, Agent, or Firm*—McAndrews, Held & Malloy, Ltd.

(57) ABSTRACT

A system and method for compensating for DC offset and/or clock drift on a wireless-enabled device is described. One embodiment includes a radio module, an A/D converter connected to the radio module, a DC tracking loop connected to the A/D converter, and a multi-hypothesis bit synchronizer.

25 Claims, 8 Drawing Sheets

SYSTEM AND METHOD FOR DC OFFSET COMPENSATION AND BIT SYNCHRONIZATION

RELATED APPLICATIONS

The present application is related to commonly owned and assigned Ser. No. 10/027,558, entitled Bluetooth Access Code Assisted Initial DC Estimation and Frame Synchronization, which is filed on even date herewith and is incorporated herein by reference.

FIELD OF THE INVENTION

The present invention relates to wireless communication devices and protocols. In particular, but not by way of limitation, the present invention relates to systems and methods for improving the quality and commercial appeal of wireless communications and wireless communication devices.

BACKGROUND OF THE INVENTION

Wireless communications and wireless communication devices are at the center of many important technological advancements. As the proliferation of these wireless devices increases, the efficiency and accuracy of the communications therebetween becomes vital to the commercial success of particular devices and particular communication protocols. One protocol that is showing great promise is Bluetooth, (*The Specification of the Bluetooth System*, v1.0 B, Dec. 1, 1999 is incorporated herein by reference) which is a wireless protocol that describes how mobile phones, computers, PDAs, peripherals and other devices can interconnect using short-range wireless connections.

To implement Bluetooth and other such wireless protocols, a device receiving a transmitted signal is required to recover bit patterns carried by the transmitted signal. This recovery process involves waveform demodulation, DC compensation, bit synchronization and bit detection. Waveform demodulation usually is implemented in a radio module and is wireless protocol dependent.

DC compensation typically involves correcting for a DC offset arising during the signal recovery process. This DC offset comprises a variation in the intended DC voltage of the recovered baseline signal caused, for example, by frequency drift in the received Bluetooth signal. Present devices compensate for DC-related imperfections in incoming signals using a variety of means, none of which are completely satisfactory. For example, certain electronic devices use analog components to calculate and track DC offset, while others use digital components. In this regard analog "DC trackers" usually are implemented as lowpass RC filters, while conventional digital approaches generally require a select number of bits to be buffered before any DC offset can be calculated.

The accuracy of the DC tracking performed by both conventional analog and digital circuits is affected by characteristics of the incoming bit patterns. For instance, when a string of high values, e.g., "1s," is received, the computed DC offset will be adjusted to a higher value even though the actual DC offset has not changed. This is because most approaches to DC tracking automatically assume an even distribution of high and low values in the received signal. In addition, in analog approaches the accuracy of DC tracking and of the associated estimated variance are sensitive to the selected time constants of the analog filters employed. In conventional digital DC tracking techniques, the accuracy of DC tracking and of the associated estimated variance are functions of the selected buffer size.

Present technology suffers drawbacks in addition to those described above. For example, wireless devices generally must also compensate for clock variances and relative transmitter-receiver clock drift that case data frames to be out of synchronization. Present systems for synchronizing frames are slow, require significant hardware, and are not entirely accurate. Accordingly, present systems can waste valuable time and unnecessarily drop frames.

Although present analog and digital approaches to computing DC offsets and synchronizing frames for wireless communications are functional, they are not sufficiently accurate or otherwise satisfactory. Accordingly, a system and method are needed to address the shortfalls of present technology and to provide other new and innovative features.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

In summary, the present invention provides a system and method for addressing problems relating to DC compensation, bit synchronization and bit detection, and may be applied within many different types of wireless receivers. In one aspect the present invention provides a system and method for compensating for DC offset and/or clock drift that impacts the operation of a wireless-enabled device. In one exemplary embodiment, the present invention can include a radio module, an analog-to-digital (A/D) converter, a DC tracking loop, and a multi-hypothesis bit synchronizer (MHBS).

The DC tracking loop, for example, can be a digital emulation of a cascade of two analog one-pole LPFs (low pass filters). The DC tracking loop provides flexibility and stability when compared to conventional one-pole LPFs. Additionally, the DC tracking loop can include a variable time constant to provide responsiveness to DC variations caused by frequency drift over time. The output of the DC tracking loop is a DC offset estimate that can account for long term drift and short term fluctuations.

The second component of this embodiment, the MHBS, is configured to compensate for clock drift and provide bit synchronization and clock control. For example, the MHBS can provide bit synchronization by making multiple timing hypotheses with a one sample offset between the adjacent hypotheses, wherein each hypothesis is based upon an accumulation of the DC compensated data over a symbol period. The MHBS then uses the sign of the accumulation for a particular set of samples as the output bit of that particular hypothesis. For example, the output bit is a "1" when the accumulated sum is positive and a "0" when the accumulated sum is negative.

To determine which of the hypotheses is most likely the correct one, the MHBS averages the absolute value of each hypothesis' accumulated sample sum over time, and compares the averaged sample sums. The hypothesis associated with the maximum averaged sample sum is assumed to be best matched to the true symbol timing. As bit detection, the MHBS outputs the bit output from the hypothesis with the maximum average sample sum.

To overcome long timing drift or random timing jitter causing bit slippage, when the maximum averaged sample sum amplitude is not from the optimal, i.e., an on-time hypothesis, the MHBS can apply a timing control logic to recenter the next symbol time. Assuming that the sample rate is N samples per symbol, when a late hypothesis corresponds to the maximum averaged sample sum, the next symbol time is (N+1) samples later rather than N. Similarly, if an early hypothesis corresponds to the maximum averaged sample sum, the next symbol time is (N−1)samples later. Thus, the MHBS recenters the symbol window in both cases, thereby preventing bit slippage.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Figure 1:
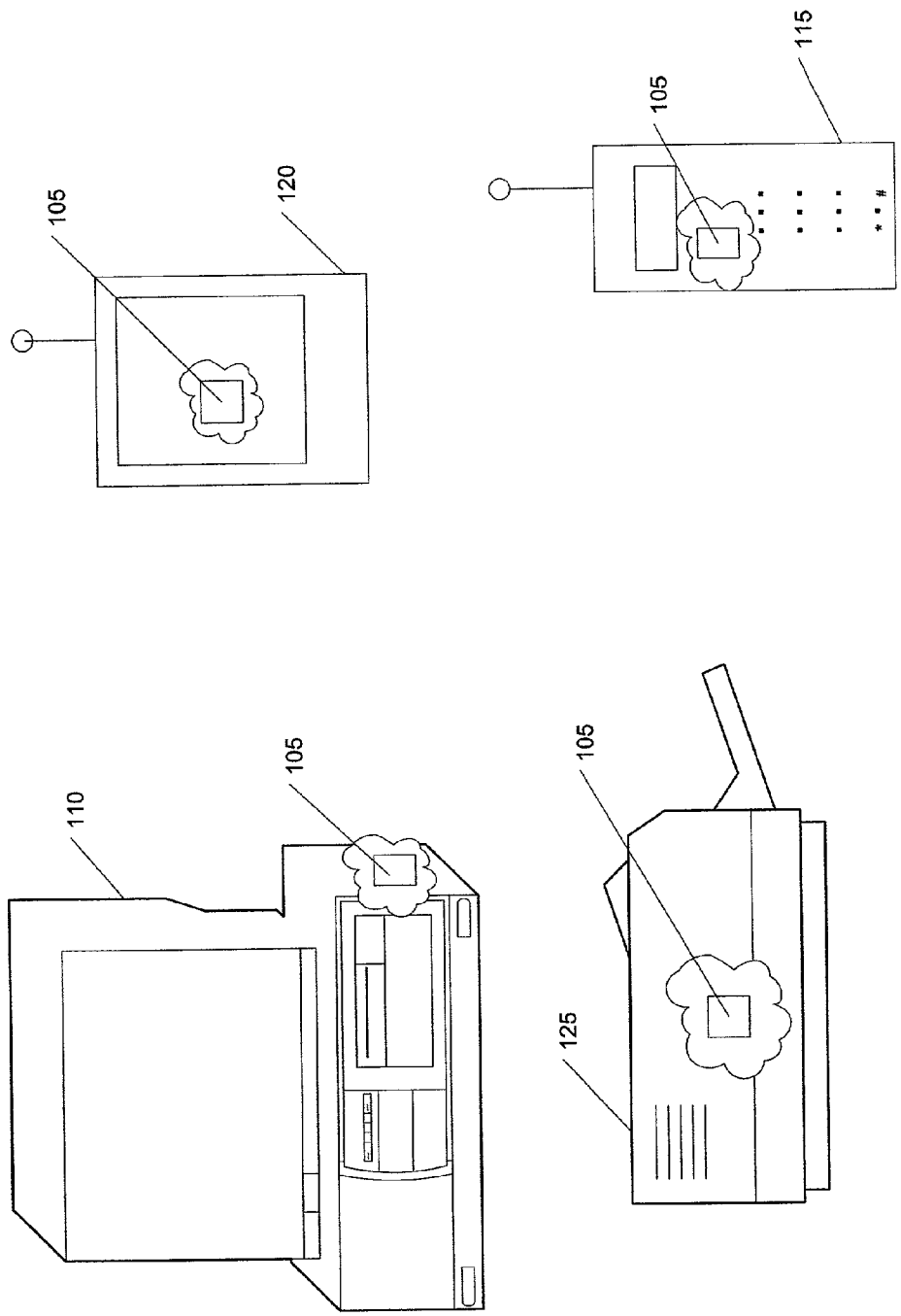
FIG. 1 illustrates various electronic devices with integrated receiver modules in accordance with the principles of the present invention.

Referring now to the drawings, where like or similar elements are designated with identical reference numerals throughout the several views, and referring in particular to FIG. 1, it illustrates examples of electronic devices with integrated receiver modules 105 constructed in accordance with the principles of the present invention. The receiver modules 105 can be implemented in a variety of ways, and preferred implementations of the receiver modules 105 are discussed in detail herein.

Although only a computer 110, a PDA (personal digital assistant) 115, cell phone 120 and peripheral device 125 are illustrated, implementations of the present invention can include any type of wireless-enabled device and should not be limited to those devices shown. Moreover, the receiver modules 105 in these various devices can include, for example, ASICs (application specific integrated circuits), software instructions, general purpose processors, or any combination thereof.

Figure 2:
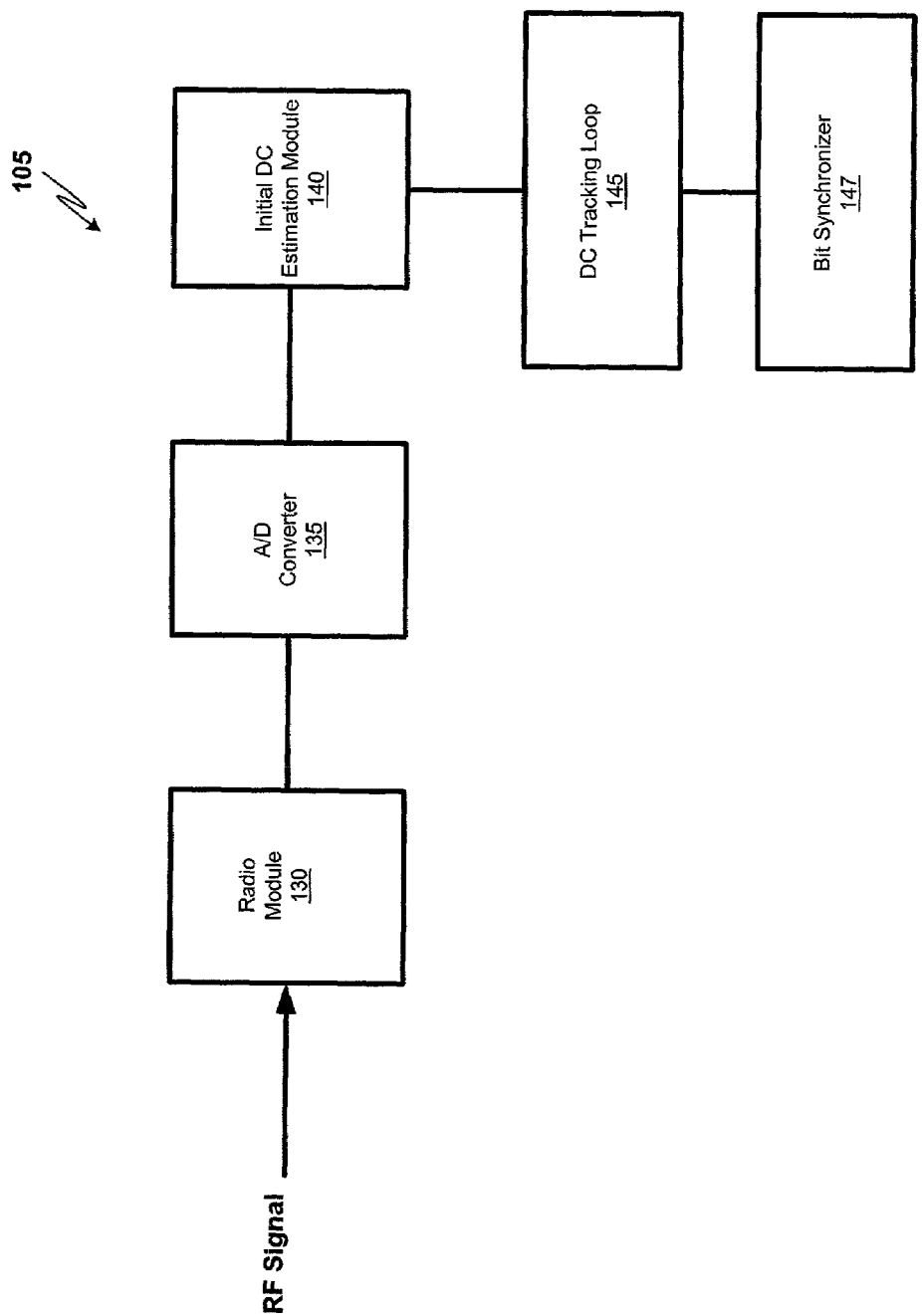
FIG. 2 illustrates in greater detail a receiver module in accordance with the present invention.

FIG. 2 illustrates one implementation of the receiver module 105 of FIG. 1. In this implementation, a RF signal (or any other type of signal) is received at the radio module 130, which demodulates and downconverts the RF signal to a baseband signal. The receiver module 130 then passes the baseband signal to the A/D converter 135, where the analog signal is converted to a digital signal. The A/D converter 135 then passes the digital signal to the initial estimation module 140, which approximates an initial DC offset within the digital signal. This initial DC offset can be passed to a DC tracker 145, which can use the initial DC offset to monitor long-term drift and to generate a corresponding DC offset value which is substracted from the incoming data signal. The resultant "DC-removed" signal is then provided by the DC tracker 145 to a bit synchronizer 147.

Figure 3:
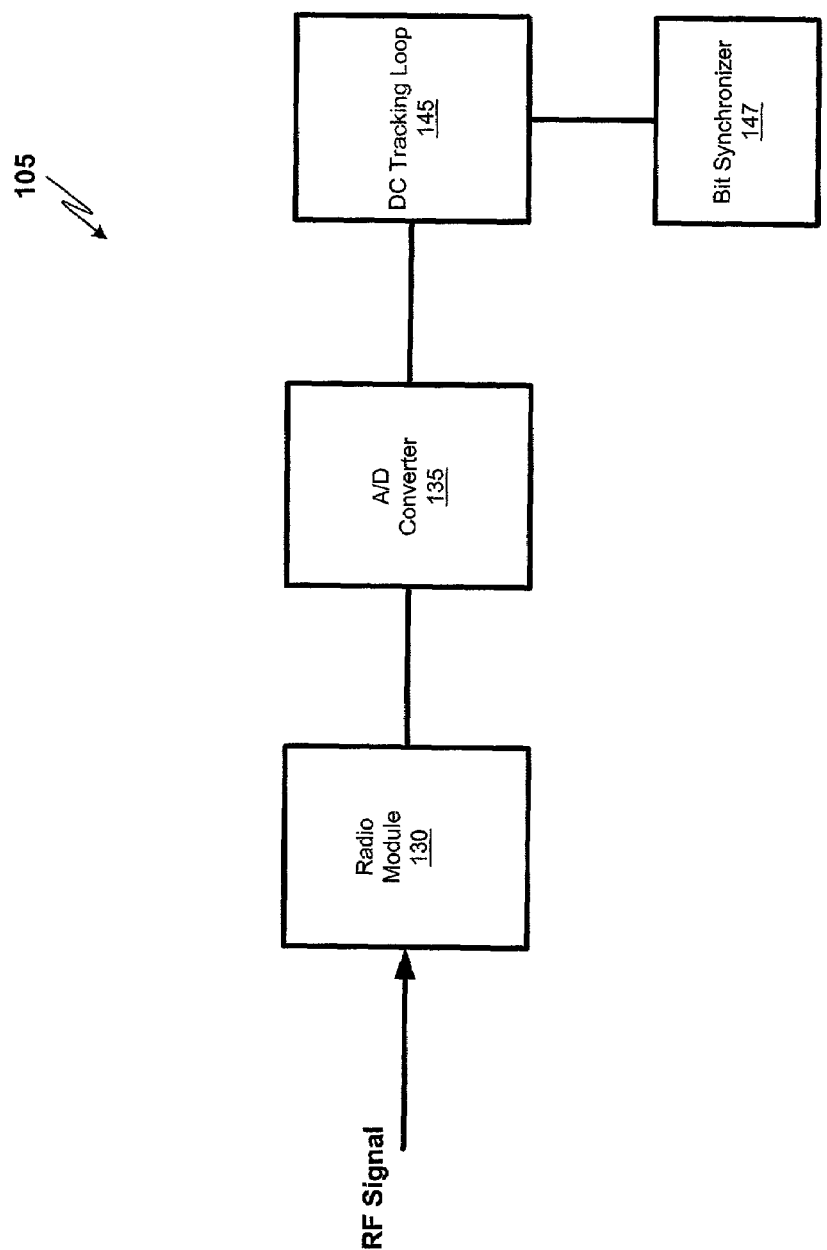
FIG. 3 illustrates an alternate embodiment of the receiver module of FIG. 1.

FIG. 3 shows an alternate embodiment of the present invention. This embodiment is similar to the embodiment shown in FIG. 2 except that the DC tracking loop 145 operates without the benefit of the initial DC offset approximated by the initial estimation module 140. Without the benefit of the initial DC offset estimate, the DC tracking loop 145 may be subject to more overshoot and longer convergence time. However, the DC tracking loop 145 is operable without the initial estimation module 140 and can therefore operate with less power and less circuitry.

Figure 4:
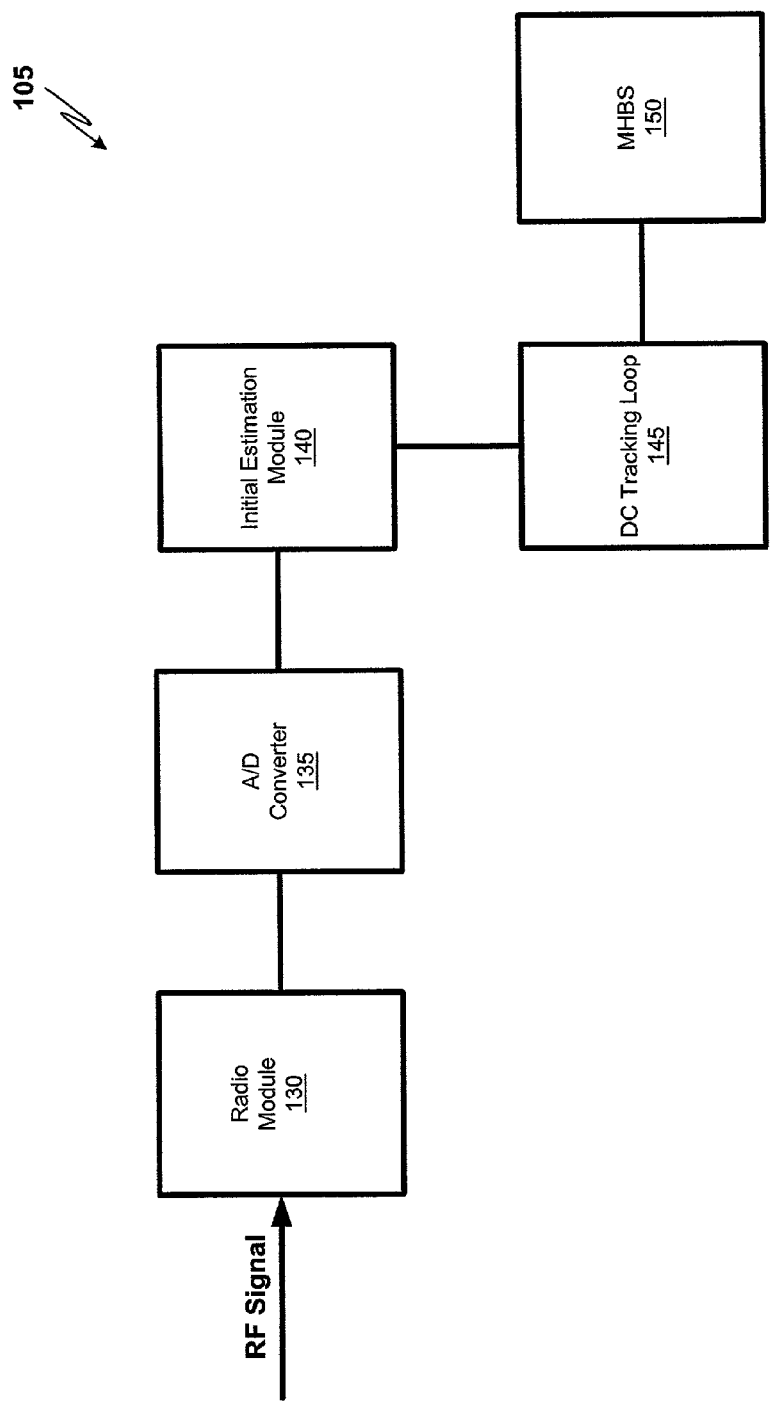
FIG. 4 illustrates an embodiment of the receiver module that also includes an MHBS.

FIG. 4 illustrates an embodiment of the present invention that includes a MHBS 150 in addition to the other components of FIG. 2. The MHBS, in this implementation, is configured to provide bit synchronization. The MHBS 150 can make multiple timing hypotheses using the samples of the incoming signal with a one sample offset between the adjacent hypotheses. In the presently preferred embodiment, three hypotheses are used, an early, an on-time and a late hypothesis. The MHBS 150 performs an accumulation of the DC compensated data received from the DC tracking loop 145 over the nominal symbol period for each of the three hypotheses. Assuming the data sampling rate is N times the symbol rate, there are nominally N samples per symbol. The sign of the sample sum is then used as the output bit of that hypothesis. For example, the output bit is a "1" if the sample sum is positive and a "0" of the sample sum is negative. If k is the current sample time index and y(i)'s are the input samples to the MHBS, the three sample sums can be represented by $$SS_E(k) = \sum_{i=k-(N+1)}^{k-2} y(i)$$

$$SS_O(k) = \sum_{i=k-N}^{k-1} y(i)$$

$$SS_L(k) = \sum_{i=k-(N-1)}^{k} y(i).$$

To determine which hypotheses' output bit is likely the correct one, the absolute value of each hypothesis' sample sum is averaged over time—called the averaged sample sum. This computation is represented by $E(k)=|SS_E(k)|$ $O(k)=|SS_O(k)|$ $L(k)=|SS_L(k)|$ $\bar{E}(k)=b \cdot E(k)+(1-b)\bar{E}(k-1)$ $$\overline{O}(k)=b\cdot O(k)+(1-b)\overline{O}(k-1)$$

$$\overline{L}(k)=b\cdot L(k)+(1-b)\overline{L}(k-1)$$

In an exemplary implementation, hardware complexity is reduced by implementing the multiplication operations in the above expressions as bit shift operations. For example, if one lets $b=\frac{1}{2}^\beta$, then multiplication of a quantity y by the parameter b may instead be effected through a bit shift operation ">>" as follows:

$$b\cdot y=(y>>\beta)$$

where the parameter $\beta$ is used to control the integration time.

A three-way comparison is then made between the averaged sample sums, and the hypothesis that corresponds to the maximum averaged sample sum is assumed to be the one best matched to the true symbol timing. The final output bit value is the bit output from the hypothesis with the maximum average sample sum amplitude.

The above set of operations are normally repeated every N samples, which is the nominal symbol rate. However, to overcome long timing drift or random timing jitter that can cause bit slippage, when the maximum average sample sum amplitude is not from the on-time hypothesis, a timing control logic can be applied to change the next symbol time. For example, when the late hypothesis corresponds to the maximum averaged sample sum, the next symbol time is (N+1) samples later rather than N. Similarly, when the early hypothesis corresponds to the maximum averaged sample sum, the next symbol time is (N−1) samples later. By adjusting the symbol time, the symbol window is recentered, and bit slippage is prevented.

Adjusting the symbol timing can impact the computation of the next averaged sample sum. However, to keep the correct averaging operation, the MHBS 150 can perform a memory swap between the feedback values of the three integrators as dictated by the direction of the rotation toward the center, e.g., the on-time sample hypothesis. For example, if the early hypothesis is the maximum, the memory swap is represented by $$tmp=\overline{L}(k-1)$$

$$\overline{O}(k-1)=\overline{E}(k-1)$$

$$\overline{L}(k-1)=\overline{O}(k-1)$$

$$\overline{E}(k-1)=tmp.$$

As can be appreciated by those skilled in the art, the direction of the memory swap is reversed if the late hypothesis instead of the early hypothesis is determined to correspond to the maximum averaged sample sum.

Figure 5:
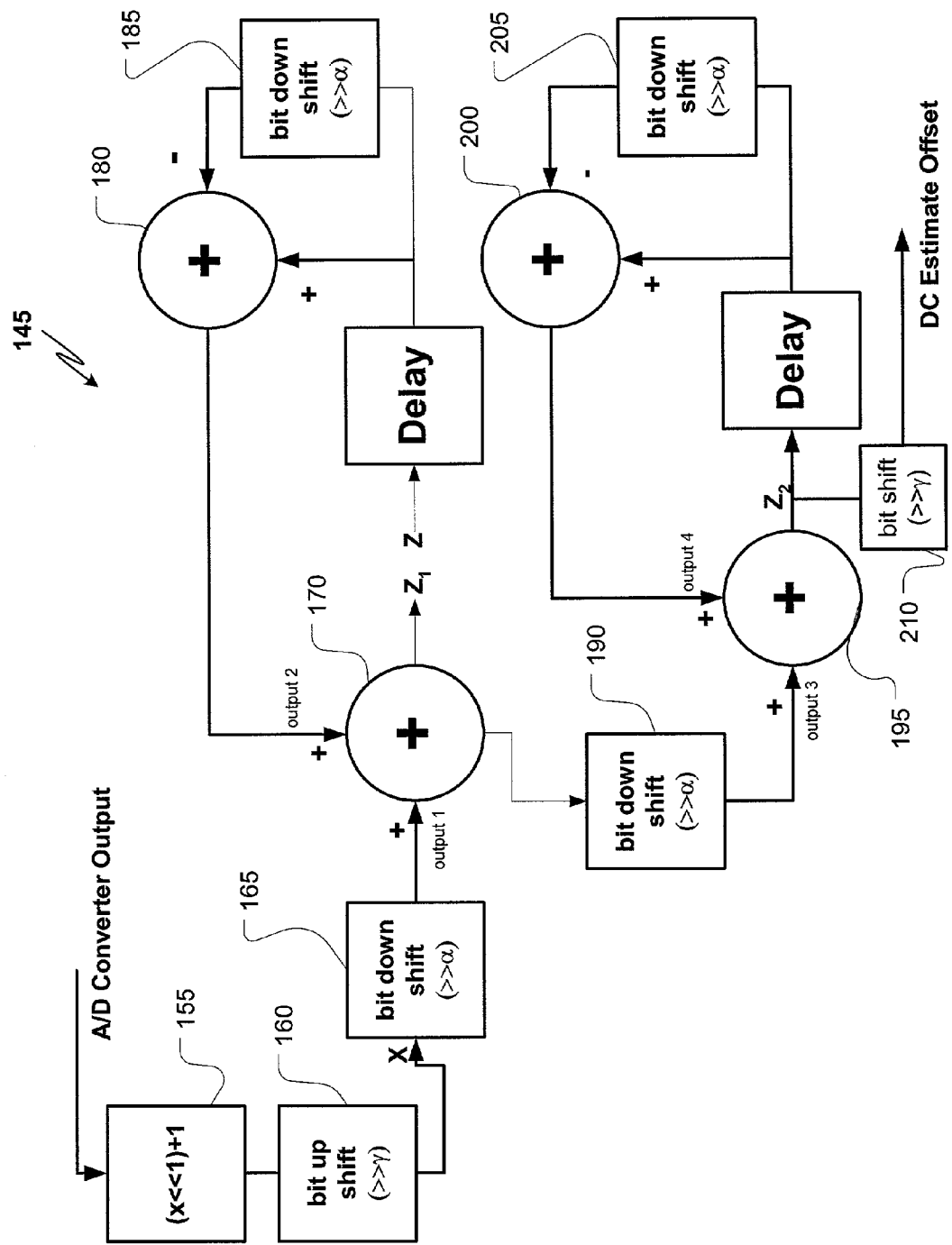
FIG. 5 illustrates an implementation of the DC tracker of FIGS. 2-4.

Referring now to FIG. 5, it illustrates in more detail an implementation of the DC tracking loop 145 shown in FIGS. 2 through 4. In this embodiment, the DC tracking loop 145 is a cascade of two one-pole LPF emulator and can be expressed by $$z_1(k)=ax(k)+(1-a)z(k-1)$$

$$z_2(k)=az_1(k)+(1-a)z_2(k-1)$$

$$z(k)=\begin{cases} z_1(k), & \text{for faster loop response} \\ (z_1(k)+z_2(k))/2, & \text{for slower loop response} \end{cases}$$

where x(k) comprises a balanced input sample (i.e., between the quantites +X and −X), and wher a is the loop time constant. Again, letting $a=\frac{1}{2}^\alpha$, then a bit shift operation ">>" may be substituted for multiplication as follows:

$$a\cdot y=(y>>\alpha)$$

Figure 6:
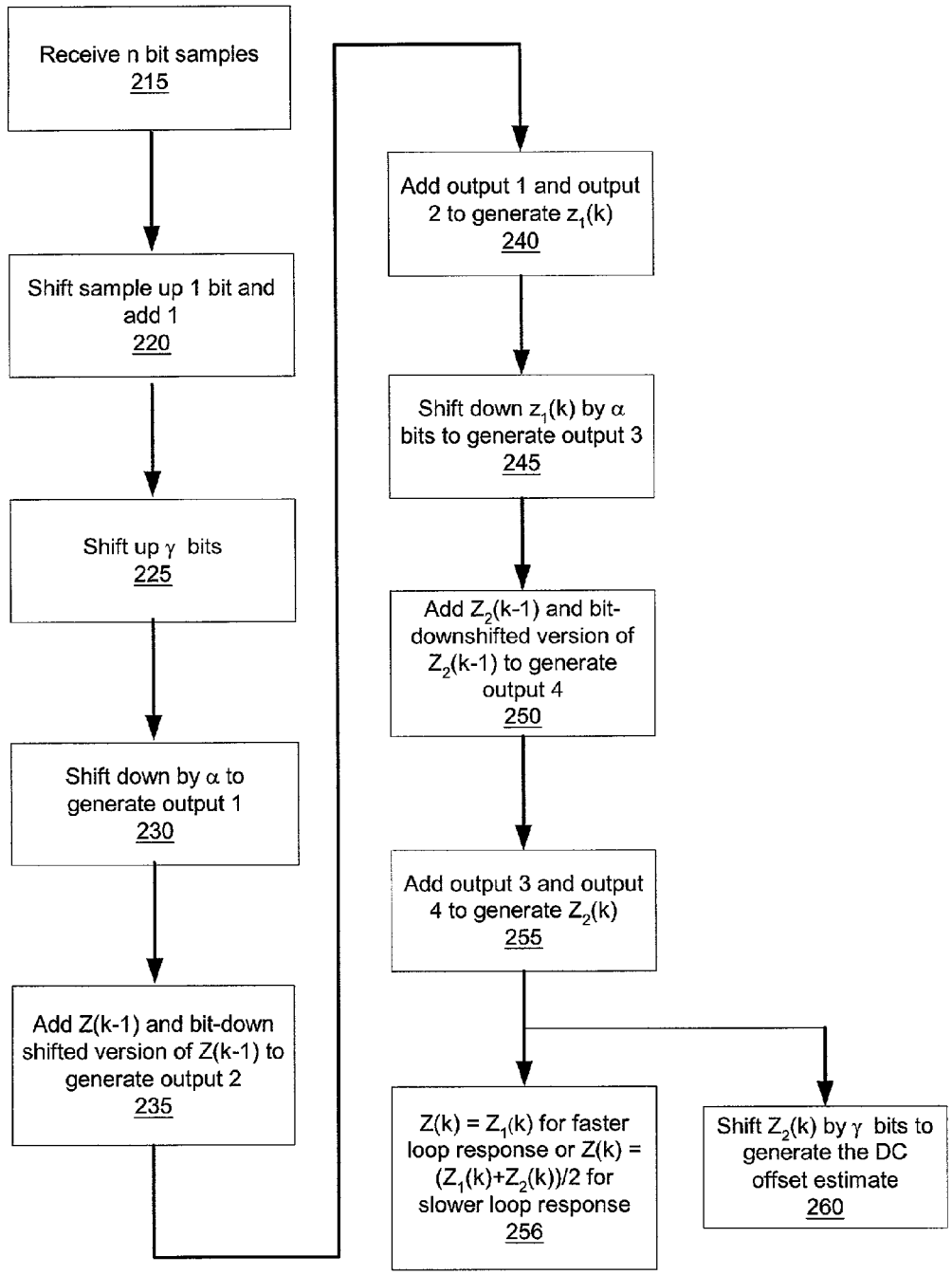
FIG. 6 is a flowchart of one method of operating the DC tracker of FIG. 5.

The operation of the DC tracking loop 145 is illustrated by reference to the flowchart in FIG. 6. Initially, shifter 155 receives an n bit sample from the A/D converter 135—preferably in the two's complement format (step 215). Shifter 155 shifts the input up by one bit and adds one (step 220). This process correctly balances the input by making the input dynamic range between—$(-2^n-1)$ and $(+2^n-1)$. Shifter 160 then shifts the output received from shifter 155 up by $\gamma$ bits to increase the operational precision inside the DC tracking loop 145 (step 225). Shifter 165 next downshifts the output from shifter 160 by $\alpha$ bitsstep 230). Moreover, the parameter $\alpha$ can be used to change the time constant of the DC tracking loop 145 and can be adjusted so that the DC tracking loop 145 is responsive and flexible enough to follow DC variations caused by frequency drift over time.

Next, the output from shifter 165 is provided to adder 170. The other input to adder 170 comes from a scaled feedback value, wherein the feedback value is z(k−1), where z(k) is represented by $$z(k)=\begin{cases} z_1(k), & \text{for faster loop response} \\ (z_1(k)+z_2(k))/2, & \text{for slower loop response} \end{cases}$$

In other words, the other input to adder 170 is the output from adder 180, which takes the difference between z(k−1) and the value of z(k−1) after being downshifted by "$\alpha$" bits within shifter 185 (step 240 and 245).

The output from adder 170 is $z_1$, which can be expressed as $$z_1(k)=(x(k)>>\alpha)+z(k-1)-(z(k-1)>>\alpha).$$

The output from adder 170, $z_1$, is provided to shifter 190 where it is downshifted by $\alpha$ bits and provided a first of the inputs to adder 195 (step 245). The output from adder 195 is $z_2(k)$, which can be expressed as $$z_2(k)=(z_1(k)>>\alpha)+z_2(k-1)-(z_2(k-1)>>\alpha).$$

$(z_2(k-1)>>\alpha)$

As shown in FIG. 5, a second of the inputs applied to adder 195 comprises a delayed version of a previous output of the adder 195 (i.e., $z_2(k-1)$) in combination (via adder 200) with this same delayed version after downshifting by $\alpha$ bits (i.e., $(z_2(k-1)>>\alpha)$) (steps 250 and 255). Finally, shifter 210 downshifts $z_2(k)$ by $\gamma$ bits so that the output of DC tracking loop 145 is a (n+1)-bit representation of the DC offset estimate (step 260).

Figure 7:
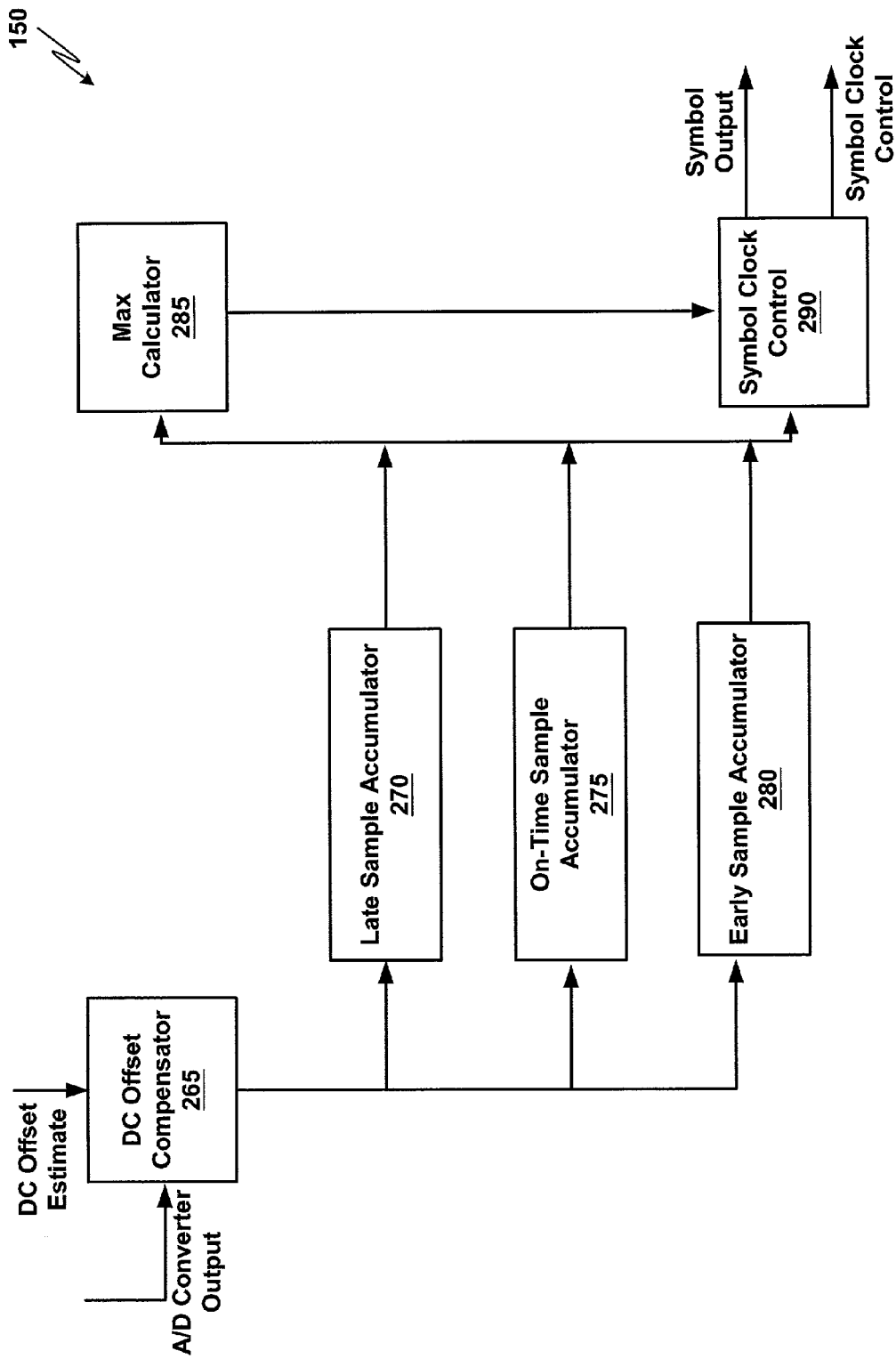
FIG. 7 illustrates a block diagram of one implementation of the MHBS of FIG. 4.

Referring now to FIG. 7, it illustrates one implementation of the MHBS 150. In this implementation, the DC offset compensator 265 computes the difference between the output of the A/D converter and a DC offset estimate as generally determined by the DC tracking loop 145. During the initial startup, however, the DC offset estimate can come from the initial estimation module 140. In both cases, the output from the DC offset compensator 265 is provided to the late sample accumulator 270, the on-time sample accumulator 275 and the early sample accumulator 280. Each of the accumulators performs an accumulation of the DC compensated data over N samples with a one sample offset between each of the accumulations. Additionally, each of the accumulators generates the sign of that accumulation as an output, which is representative of the sample symbol. As previously described, the detector output bit is "1" if the accumulation is positive and "0" if the accumulation is negative.

If k is the current sample time index and y(i)'s are the input samples to the MHBS 150, the three sample sums corresponding to the early, on-time and late sample hypotheses are respectfully represented as:

$$SS_E(k) = \sum_{i=k-(N+1)}^{k-2} y(i);$$

$$SS_O(k) = \sum_{i=k-N}^{k-1} y(i); \text{ and}$$

$$SS_L(k) = \sum_{i=k-(N-1)}^{k} y(i).$$

To determine which hypothesis' output bit is most likely correct, as an approximation to the maximum likelihood estimation, the absolute value of each hypothesis' accumulation (also called a sample sum) is averaged over time. This is represented by $$E(k)=|SS_E(k)|$$

$$O(k)=|SS_O(k)|$$

$$L(k)=|SS_L(k)|$$

$$\overline{E}(k)=(E(k)>>\beta)+\overline{E}(k-1)-(\overline{E}(k-1)>>\beta)$$

$$\overline{O}(k)=(O(k)>>\beta)+\overline{O}(k-1)-(\overline{O}(k-1)>>\beta)$$

$$\overline{L}(k)=(L(k)>>\beta)+\overline{L}(k-1)-(\overline{L}(k-1)>>\beta)$$

where the parameter β is used to control the integration time.

As previously described, the max calculator 285 performs a comparison between the averaged sample sums. The hypothesis associated with the maximum averaged sample sum is assumed to be the one best matched to the true symbol timing, and the final output bit value—the "symbol" output of FIG. 7—is the bit output from the hypothesis with the maximum average sample sum.

To overcome long timing drift or random timing jitter causing bit slippage, when the maximum averaged sample sum amplitude is not from the optimal, e.g., an on-time sample hypothesis, the symbol clock control 290 recenters the next symbol time. Assuming that the sample rate is N samples per symbol, when the late sample hypothesis corresponds to the maximum averaged sample sum, the next symbol time is (N+1) samples later rather than N. Similarly, if an early hypothesis corresponds to the maximum averaged sample sum, the next symbol time is (N−1) samples later.

Figure 8:
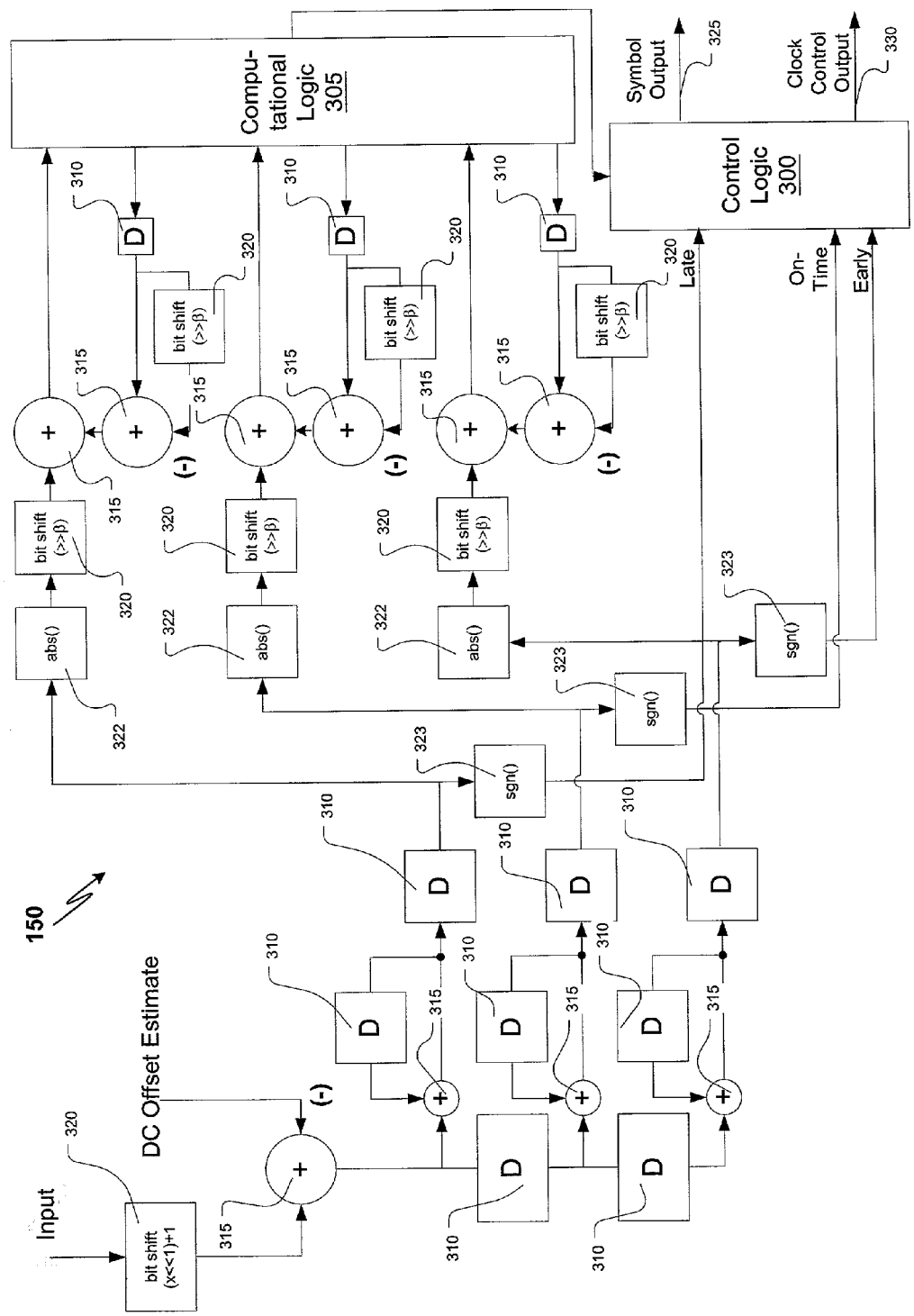
FIG. 8 illustrates the MHBS of FIG. 7 in greater detail.

FIG. 8 shows a more detailed diagram of the MHBS 150. This embodiment uses a plurality of delay devices 310, adders 315, shifters 320, absolute value modules 322, and sign modules 323 to determine the symbol output 325 and to generate a clock control output 330 that controls the symbol timing. Additionally, this embodiment uses two logic units: a control logic unit 300 and a computational logic unit 305. The control logic unit 300 is configured to select the correct symbol output and to correct the symbol clock, and the computational logic unit 305 is configured to identify the maximum of the average sample sum amplitudes and to perform the necessary memory swaps—whether in a separate memory unit or in a memory integrated with the computational logic 305. In operation, the embodiment shown in FIG. 8 operates generally the same as the embodiment shown in FIG. 7.

In conclusion, the present invention provides, among other things, a system and method for compensating for DC offset and for clock drift and jitter. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method for operating a wireless device, the method comprising:
   receiving a data signal;
   accumulating a first sample sum value for a first set of DC compensated samples of the received data signal, the first set of DC compensated samples corresponding to a first timing hypothesis;
   accumulating a second sample sum for a second set of DC compensated samples of the received data signal, the second set of DC compensated samples corresponding to a second timing hypothesis;
   accumulating a third sample sum value for a third set of DC compensated samples of the received data signal, the third set of DC compensated samples corresponding to a third timing hypothesis;
   computing a first averaged sample sum using the first sample sum;
   computing a second averaged sample sum using the second sample sum;
   computing a third averaged sample sum using the third sample sum;
   identifying the maximum of the first averaged sample sum, the second averaged sample sum, and the third averaged sample sum; and
   generating an output symbol corresponding to the identified maximum.

2. The method of claim 1 wherein the output symbol is of a first value when the sample sum corresponding to the identified maximum is positive and is otherwise of a second value.

3. The method of claim 1,
   wherein the first sample sum value is defined as $$SS_E(k) = \sum_{i=k-(N+1)}^{k-2} y(i)$$

and wherein the second sample sum is defined as $$SS_O(k) = \sum_{i=k-n}^{k-1} y(i)$$

and wherein the third sample sum is defined as $$SS_L(k) = \sum_{i=k-(N-1)}^{k} y(i).$$

and wherein k an integer representing a sample time index and N is an integer representing a multiple of a symbol rate.

4. The method of claim 3,
wherein the first averaged sample sum is defined as $$\overline{E}(k)=(E(k)>>\beta)+\overline{E}(k-1)-(\overline{E}(k-1)>>\beta)$$

in which >> is a bit shift operation and in which $\beta$ is a parameter used to control integration time,
and wherein the second averaged sample sum is defined as $$\overline{O}(k)=(O(k)>>\beta)+\overline{O}(k-1)-(\overline{O}(k-1)>>\beta)$$

and wherein the third averaged sample sum is defined as $$\overline{L}(k)=(L(k)>>\beta)+\overline{L}(k-1)-(\overline{L}(k-1)>>\beta)$$

wherein $$E(k)=|SS_E(k)|$$

$$O(k)=|SS_O(k)|$$

$$L(k)=|SS_L(k)|.$$

5. The method of claim 1, further comprising:
responsive to the identified maximum corresponding to the third sample sum, adjusting a symbol timing.

6. The method of claim 5, wherein a standard next symbol time is plus n samples, the method further comprising:
adjusting the next symbol timing to be plus n+1 samples.

7. The method of claim 1, further comprising:
computing a DC offset estimate;
wherein the accumulation of the first sample sum, the second sample sum, and the third sample sum accounts for the computed DC offset estimate.

8. The method of claim 7, further comprising:
subtracting the DC offset estimate from a first set of samples to thereby generate the first set of DC compensated samples.

9. The method of claim 8, further comprising:
receiving the DC offset estimate from an initial offset calculator.

10. The method of claim 9, further comprising:
calculating the DC offset estimate using a pilot signal.

11. The method of claim 1, wherein the first set of DC compensated samples and the second set of DC compensated samples are offset by one sample.

12. An electronic device comprising:
a DC offset compensator;
a plurality of sample accumulators, each of the plurality of sample accumulators being coupled with the DC offset compensator; and
a maximum identifier coupled with each of the plurality of sample accumulators;
wherein the maximum identifier is configured to identify the maximum output of the plurality of sample accumulators and cause an output to be generated according to the identified maximum output.

13. The electronic device of claim 12, wherein the plurality of sample accumulators includes an on-time accumulator, the electronic device further comprising:
a symbol clock control coupled with the maximum identifier;
wherein the symbol clock control is configured to adjust a symbol timing responsive to the maximum identifier identifying the maximum output to be from one of the plurality of sample accumulators other than the on-time accumulator.

14. The electronic device of claim 12, further comprising:
a DC tracking loop coupled with the DC offset compensator;
wherein the DC tracking loop is configured to provide a DC estimate to the DC offset compensator.

15. The electronic device of claim 12, wherein the electronic device is a cellular phone.

16. The electronic device of claim 12, wherein the electronic device is a personal digital assistant.

17. The electronic device of claim 12, wherein the electronic device is a peripheral device.

18. The electronic device of claim 12, wherein the plurality of accumulators comprises:
an early accumulator;
an on-time accumulator; and
a late accumulator.

19. An apparatus comprising:
means for receiving a data signal;
means for accumulating a first sample sum for a first set of samples of the received data signal, the first set of samples corresponding to a first timing hypothesis;
means for accumulating a second sample sum for a second set of samples of the received data signal, the second set of samples corresponding to a second timing hypothesis;
means for accumulating a third sample sum for a third set of samples of the received data signal, the third set of samples corresponding to a third timing hypothesis;
means for computing a first averaged sample sum using the first sample sum;
means for computing a second averaged sample sum using the second sample sum;
means for computing a third averaged sample sum using the third sample sum;
means for identifying the maximum of the first averaged sample sum, the second averaged sample sum, and the third averaged sample sum; and
means for outputting a symbol corresponding to the identified maximum;
wherein the output symbol is a first value when the sample sum corresponding to the identified maximum is positive.

20. The apparatus of claim 19, further comprising:
means for adjusting symbol timing responsive to the identified maximum corresponding to the third sample sum.

21. The apparatus of claim 20, wherein a standard next symbol time is plus n samples, the apparatus further comprising:
means for adjusting the next symbol timing to be plus n+1 samples.

22. The apparatus of claim 19, further comprising:
means for compensating for a DC offset;
wherein the means for accumulating the first sample sum, the second sample sum, and the third sample sum accounts for the computed DC offset.

23. The apparatus of claim 19, wherein the means for compensating for the DC offset comprises:
means for subtracting a DC offset estimate from the first set of samples.

24. The apparatus claim 23, further comprising:
means for receiving the DC offset estimate from an initial offset calculator.

25. The apparatus of claim 23, further comprising:
means for calculating the DC offset estimate using a pilot signal.

* * * * *

UNITED STATES PATENT AND TRADEMARK OFFICE
CERTIFICATE OF CORRECTION

| | | |
|---|---|---|
| PATENT NO. | : 7,231,000 B2 | Page 1 of 1 |
| APPLICATION NO. | : 10/035567 | |
| DATED | : June 12, 2007 | |
| INVENTOR(S) | : Rebecca Yuan | |

It is certified that error appears in the above-identified patent and that said Letters Patent is hereby corrected as shown below:

Column 10, line 54 delete "sample sum" and insert --DC value--.

Signed and Sealed this

Thirteenth Day of November, 2007

JON W. DUDAS
*Director of the United States Patent and Trademark Office*